(12) United States Patent
Bonino et al.

(10) Patent No.: US 9,702,689 B2
(45) Date of Patent: Jul. 11, 2017

(54) USE OF A FULL WIDTH ARRAY IMAGING SENSOR TO MEASURE REAL TIME FILM THICKNESSES ON FILM MANUFACTURING EQUIPMENT

(71) Applicant: XEROX CORPORATION, Norwalk, CT (US)

(72) Inventors: Paul S. Bonino, Ontario, NY (US); Robert P. Herloski, Webster, NY (US); Jason M. LeFevre, Penfield, NY (US)

(73) Assignee: Xerox Corporation, Norwalk, CT (US)

( * ) Notice: Subject to any disclaimer, the term of this patent is extended or adjusted under 35 U.S.C. 154(b) by 56 days.

(21) Appl. No.: 14/743,491

(22) Filed: Jun. 18, 2015

(65) Prior Publication Data
US 2016/0370174 A1    Dec. 22, 2016

(51) Int. Cl.
*G01B 11/06*    (2006.01)

(52) U.S. Cl.
CPC ...... *G01B 11/0683* (2013.01); *G01B 11/0633* (2013.01); *G01B 11/0691* (2013.01)

(58) Field of Classification Search
CPC .................................................. G01B 11/0683
See application file for complete search history.

(56) References Cited

U.S. PATENT DOCUMENTS

| | | | |
|---|---|---|---|
| 5,278,589 A | 1/1994 | Wong | |
| 5,365,074 A | 11/1994 | Genovese | |
| 6,351,308 B1* | 2/2002 | Mestha | G01J 3/28 250/226 |
| 6,904,255 B2 | 6/2005 | Kera et al. | |
| 6,975,949 B2 | 12/2005 | Mestha et al. | |
| 7,177,585 B2 | 2/2007 | Matsuzaka et al. | |
| 8,203,769 B2 | 6/2012 | Herloski et al. | |
| 8,368,002 B2 | 2/2013 | Hosier et al. | |
| 9,448,346 B2 | 9/2016 | Ockenfuss | |
| 2002/0001084 A1 | 1/2002 | Yokozawa et al. | |
| 2002/0094484 A1 | 7/2002 | Buchsbaum et al. | |
| 2010/0092083 A1* | 4/2010 | Herloski | G01J 3/02 382/168 |
| 2012/0021539 A1* | 1/2012 | Allenic | G01B 11/0683 438/7 |
| 2013/0095577 A1* | 4/2013 | Milshtein | G01B 11/0683 438/7 |
| 2015/0045636 A1 | 2/2015 | Novotny et al. | |
| 2015/0203966 A1* | 7/2015 | Budiarto | G01B 11/0683 427/10 |

OTHER PUBLICATIONS

Author Unknown, "Micro-Patterned Optical Filters", Retrieved from the internet on May 29, 2015, http://a8859ac08703feae2ef0-3c64237a4c774bc09c139d4dc157b552.r26.cf2.rackcdn.com/Patterned-Coatings-1.0.0.pdf, pp. 1-2.

* cited by examiner

*Primary Examiner* — Tarifur Chowdhury
*Assistant Examiner* — Omar Nixon
(74) *Attorney, Agent, or Firm* — MH2 Technology Law Group LLP (57) ABSTRACT

A method for providing film-thickness analysis with a spectrophotometer includes configuring an illuminator to emit a light beam at a film deposited on a substrate surface, configuring a linear sensor to receive light reflecting off the deposited film on the substrate surface via a gradient index lens and a linear variable filter, and configuring a processor to determine thickness of the film based on spectral reflectivity of the film received from the linear sensor.

16 Claims, 7 Drawing Sheets

USE OF A FULL WIDTH ARRAY IMAGING SENSOR TO MEASURE REAL TIME FILM THICKNESSES ON FILM MANUFACTURING EQUIPMENT

FIELD

The present disclosure relates to a system for providing analysis of a deposited material, such as thickness monitoring of a film deposited on a substrate surface, with a spectrophotometer.

BACKGROUND

In high end printing or publishing systems, spectrophotometers are used to characterize the quality of the color output of the system, and to provide a mechanism to adjust the color output characteristics of the system. In many such systems the spectrophotometer is an off-line device, in which a print from the system is carried to the spectrophotometer for measurement. For ease of use and integration, it is often desired to have the spectrophotometer inline to the print path, so that sheets or media are scanned automatically, with little or no user interaction. Current prior art inline spectrophotometers (ILS) are relatively expensive and require extensive calibration techniques.

It would be desirable to provide a compact, low cost, spectrophotometer for in-line color output and/or thickness measurements.

SUMMARY

In an embodiment there is a method for providing film-thickness analysis with a spectrophotometer. The method includes configuring an illuminator to emit a light beam at a film deposited on a substrate surface, configuring a linear sensor to receive light reflecting off the deposited film on the substrate surface via a gradient index lens and a linear variable filter, and configuring a processor to determine thickness of the film based on spectral reflectivity of the film received from the linear sensor. The illuminator and linear sensor are positioned adjacent to the substrate surface. The gradient index lens is placed in an optical path of the light reflecting off the substrate surface and is positioned in between the substrate surface and a linear variable filter. The linear variable filter is placed in the optical path of the light reflecting off the substrate surface and is positioned between the linear sensor and the gradient index lens. The linear variable filter is an optical filter having a bandpass coating. A property of the bandpass coating is varied across the length of the linear variable filter so as to shift a center wavelength of the linear variable filter linearly across the length of the linear variable filter.

In another embodiment, there is a method of fabricating a photoreceptor. The method includes moving a substrate at a substrate feed speed through a film deposition system that has at least one film deposition station; and activating the at least one film deposition station to deposit a liquid on the substrate. An amount of the liquid is defined by a deposition rate and a deposition volume. The method also includes forming a first layer on the substrate from the liquid; providing light to an in-line spectrophotometer and obtaining spectroscopic response data representing at least one of the substrate and the first layer. The light is reflected off at least one of a surface of the first layer and a surface of the substrate or is transmitted through at least one of the first layer and the substrate. The method also includes determining, using at least one electronic processor and based on the spectrophotometric data, a thickness of at least one of the substrate and the first layer; comparing, using at least one electronic processor, the measured thickness value to a predetermined thickness value; and adjusting at least one of the substrate feed speed, the deposition rate, and the deposition volume.

In yet another embodiment, there is a system for obtaining thickness data of deposited films using a spectrophotometer during assembly of a photoreceptor. The system includes: a spectrophotometer configured to obtain spectroscopic response measurements of light reflected off a surface or transmitted through a surface of at least one of a substrate and a layer deposited over the substrate; at least one electronic processor communicatively coupled to the spectrophotometer and configured to: determine, using at least one electronic processor and based on the spectrophotometric data, a thickness of at least one of the substrate and the layer, and compare, using at least one electronic processor, the measured thickness value to a predetermined thickness value; a substrate feeder for providing the substrate with a substrate feed speed; and a layer deposition station communicatively coupled to the at least one electronic process, the layer deposition station configured for depositing the layer over the substrate with at least one of a deposition rate and a deposition volume.

Other objects, features, and advantages of one or more embodiments will become apparent from the following detailed description, and accompanying drawings, and the appended claims. It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

Various embodiments are disclosed, by way of example only, with reference to the accompanying schematic drawings in which corresponding reference symbols indicate corresponding parts, in which.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawing that forms a part thereof, and in which is shown by way of illustration a specific exemplary embodiment in which the present teachings may be practiced. The following description is, therefore, merely exemplary.

Figure 1:
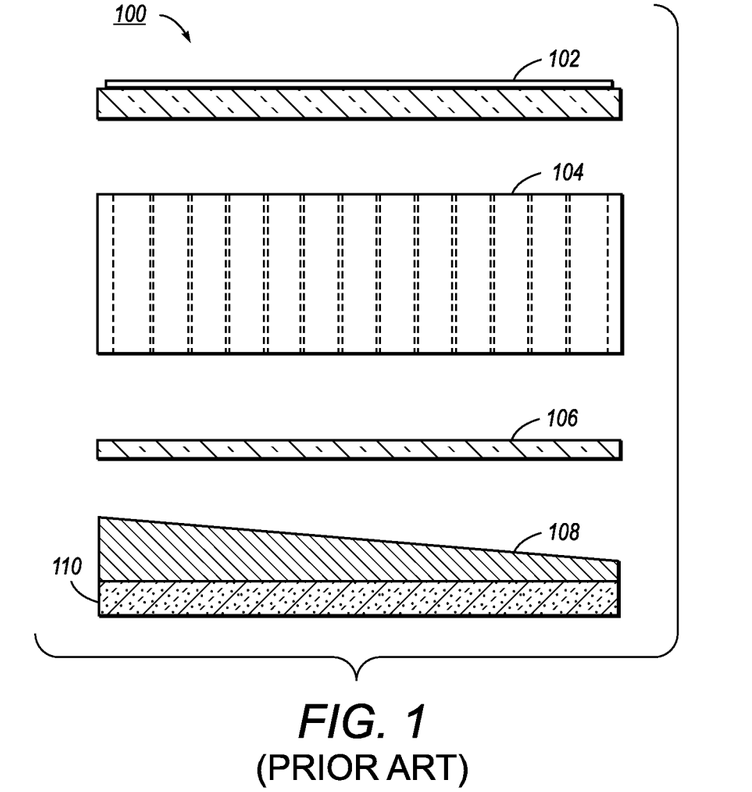
FIG. 1 shows a related art system for determining the spectral transmittance of samples with a spectrophotometer.

FIG. 1 shows a prior art system 100 that is used for determining the spectral transmittance of samples with a spectrophotometer. The system 100 includes test sample 102, an illuminator (not shown), a self-focusing lens array (e.g., SELFOC® lens array) 104, a collimating lens 106, a linear variable filter 108, and a linear sensor 110. The illuminator emits light beams at the test sample 102, and the light beams reflecting off or transmitted through the test sample 102 are received and analyzed by the linear sensor 110. The light beams reflecting off or transmitted through the test sample 102 are received by the linear sensor 110 via the SELFOC® lens array 104, the collimating lens 106, and the linear variable filter 108. The effect of effectively broadening the nominal bandpass characteristics of the linear variable filter is eliminated by collimating the light beams (i.e., reflecting off the test sample 102) entering the linear variable filter 108 and the linear sensor 110. The light beams (i.e., reflecting off or transmitted through the test sample 102) are collimated by using the collimating lens 106 positioned in between the SELFOC® lens array 104 and the linear variable filter 108.

In contrast, the present disclosure proposes a system for providing thickness analysis of a film deposited on a substrate surface with a spectrophotometer. The system of the present disclosure is devoid of a collimating lens positioned in between the gradient index lens (e.g., SELFOC® lens) and the linear variable filter. The present disclosure proposes maintaining a gap between the linear variable filter and the linear sensor, where the size of the gap is small enough to ensure the effect of effectively broadening the nominal bandpass characteristics of the linear variable filter is acceptable. In one embodiment, the gap maintained between the linear variable filter and the linear sensor is small, for example, in the order of about 1 millimeter. In addition, the angular spread of light imaged by the gradient index lens (e.g., Selfoc lens) is also maintained small, thus, the effect of effectively broadening the nominal bandpass characteristics of the linear variable filter is acceptable.

Figure 3A:
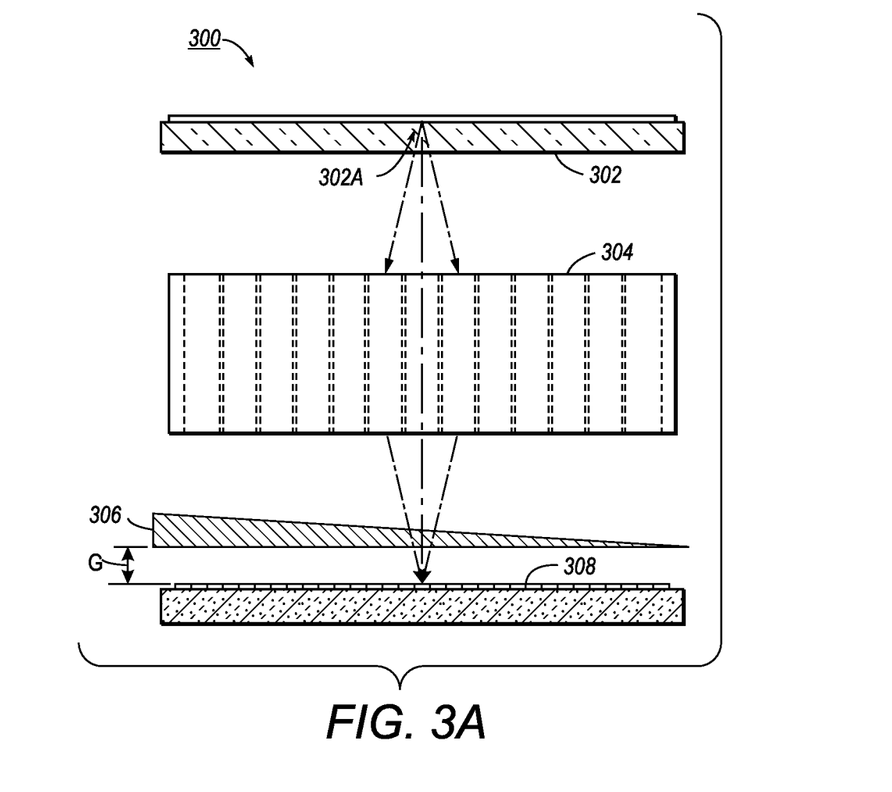
FIGS. 3A-3B show different views of a system for providing color analysis of a toner image on an image bearing surface with a spectrophotometer in accordance with an embodiment of the present disclosure.
Figure 3B:
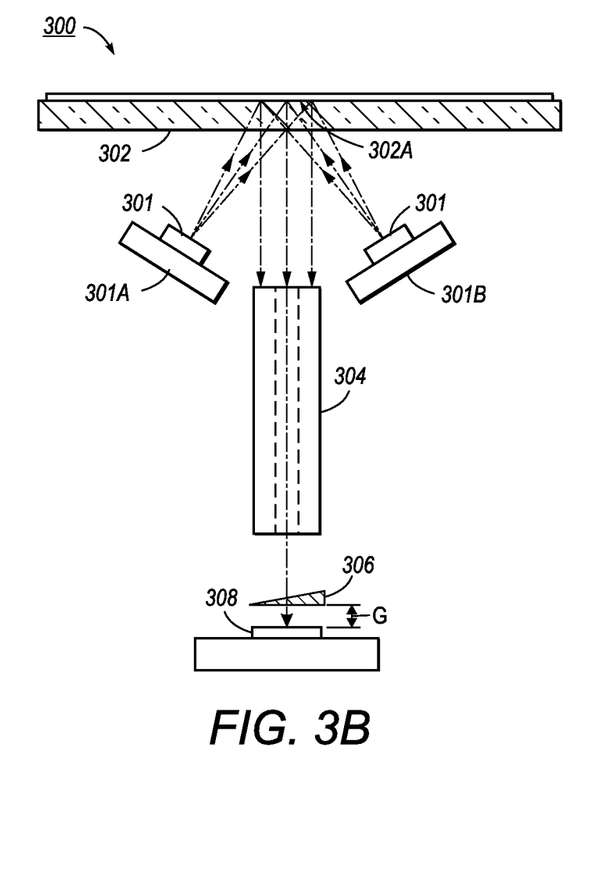
Figure 3C:
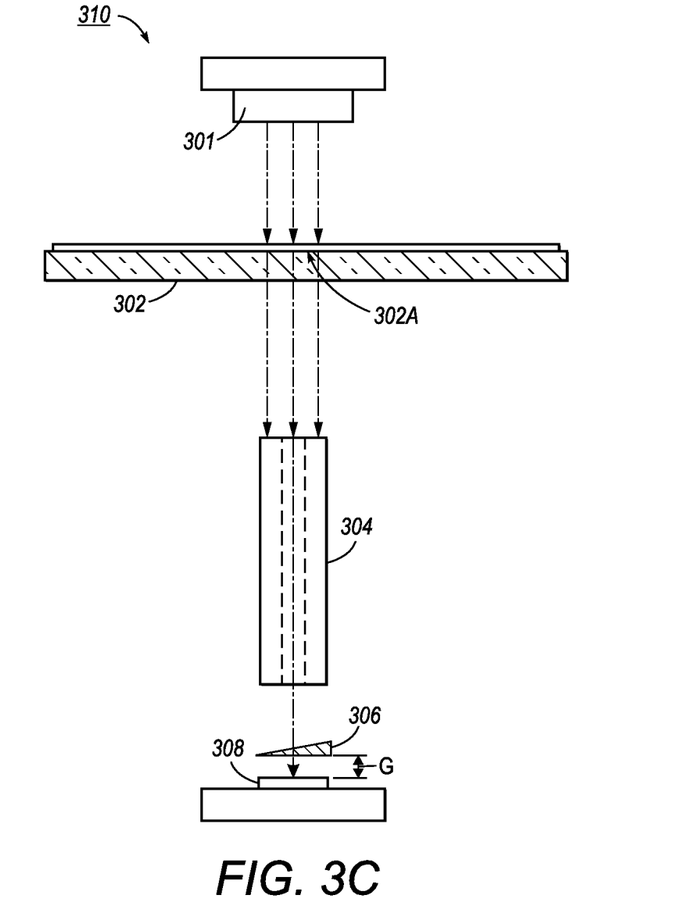
FIG. 3C is a view of an alternate system for providing spectral analysis of a material on substrate surface with a spectrophotometer in accordance with an embodiment of the present disclosure.

In one embodiment, as shown in FIGS. 3A-3C, sensing systems 300 and 310 of the present disclosure each include an illuminator 301. In FIG. 3B, the illuminator 301 is positioned adjacent to the substrate surface 302, the illuminator being configured to emit light at a material arranged as a layer, including a film 302A like a thin film, disposed over the surface. In FIG. 3C, the illuminator is positioned adjacent to the substrate, the illuminator being configured to emit light through the material of film 302A. The sensing systems 300 and 310 each also include a linear sensor 308 positioned adjacent to the substrate surface 302. The linear sensor 308 may be configured to receive the light from the illuminator, such as light reflected by (as in FIG. 3B) or transmitted through (as in FIG. 3C) one or more of the substrate, the substrate's surface and the material formed as film 302A. The sensing systems also include a gradient index lens 304 placed in the optical path of the light beams reflecting off the substrate surface 302; and a linear variable filter 306 placed in the optical path of the light beams reflecting off or transmitted through the substrate surface 302. The gradient index lens is optional. The sensing systems may be devoid of a collimating lens positioned in between the gradient index lens 304 and the linear variable filter 306, and the linear variable filter 306 and the linear sensor 308 are spaced apart by a gap G. The illuminator 301 is configured to emit a light beam at a deposited film 302A on the substrate surface 302. The linear sensor 308 is configured to receive the light beams reflecting off or transmitted through the deposited film 302A on the substrate surface 302. The light beams reflecting off the deposited film 302A on the substrate surface 302 are directed to the linear sensor 308 by the gradient index lens 304. The gradient index lens 304 is positioned in between the substrate surface 302 and the linear variable filter 306. The linear variable filter 306 is positioned between the linear sensor 308 and the gradient index lens 304.

In one embodiment, the substrate surface 302 of film manufacturing system is selected from a web substrate, such as the web on which various layers of a photoreceptor belt are deposited during manufacturing. For example, the substrate surface 302 of a film manufacturing system may be a substrate that is fed in a continuous feed arrangement or in a roll-to-roll arrangement. The substrate may also include any substrate with surface on which a toner image is received, such as in a printing system, and this may be an intermediate surface (i.e., a drum or belt on which a toner image is formed prior to transfer to the printed document). For example, a "tandem" xerographic color printing systems (e.g., U.S. Pat. Nos. 5,278,589; 5,365,074; 6,904,255 and 7,177,585, each of which are incorporated by reference), typically include plural print engines transferring respective colors sequentially to an intermediate image transfer surface (e.g., belt or drum) and then to the final substrate.

The image printing system generally has two important dimensions: a process (or slow scan) direction and a cross-process (or fast scan) direction. The direction in which the substrate surface (i.e., an image bearing surface) moves is referred to as process (or slow scan) direction, and the direction in which the plurality of sensors are oriented is referred to as cross-process (or fast scan) direction. The cross-process (or fast scan) direction is generally perpendicular to the process (or slow scan) direction.

In one embodiment, an object being deposited on a substrate is a material, which may be deposited as a liquid and later dried, in the form of a layer, including a film 302A like a thin film film. Film 302A may be disposed on a web substrate, where the web is illuminated by the illuminator 301. In another embodiment, an object being deposited on a substrate is a printed toner image, for example, on a document of interest, where the document to be scanned is illuminated by the illuminator 301. The substrate's surface may be web surface, such as the web from which belt photoreceptors are manufactured, wherein each layer of the belt photoreceptor is deposited on the web while the web is in motion. Accordingly, film 302A may be one or more of the layers that make up the photoreceptor and are deposited on the substrate during manufacturing. Thus, the substrate may be a web which may includes polymeric materials. Accordingly, in one embodiment, the film 302A being imaged is a layer of a photoreceptor drum, for example, on a web, where the web being scanned with film deposited thereon is illuminated by the illuminator 301. The substrate may partially or fully transmit a portion of the light emitted by the illuminator, or may partially or fully reflect the light emitted by the illuminator. The substrate may be caused to move in a process direction by a feeder (not shown) of a system that deposits material on the substrate, for example a print system. Accordingly, the linear sensor 308 may be configured to capture spectral response in a process, cross-process or both the process and cross-process directions.

The illuminator 301 may be an array of light emitting diodes (LEDs) or any other suitable illuminator (e.g., a fluorescent light source). For example, as shown in the illustrated embodiment in FIG. 3B, the illuminator 301 may include two linear LED arrays 301A, 301B, one on each side of the gradient index lens 304 and the linear sensor 308. In another embodiment, the illuminator 301 may include a single linear LED array. In yet another embodiment, an LED array on one side and a reflective mirror on the other side may be used instead of two linear LED arrays. The LED arrays could be all one color, e.g., white or of multiple colors, as described in U.S. Pat. No. 6,975,949, incorporated herein by reference. The illuminator arrays 301A and 301B may include a plurality of discrete illuminator elements that are spaced in a linear arrangement. Preferably, the illuminator elements are LEDs that are equally spaced at regular intervals. In one embodiment, light guides or lens arrangements may be used to transfer light from LEDs to the film 302A.

The gradient index lens 304 is positioned in between the substrate surface 302 and the linear variable filter 306. In one embodiment, the gradient index lens 304 may be used to perpendicularly image the deposited film 302A on the substrate surface 302 onto the linear sensor 308. In one embodiment, the gradient index lens 304 is a SELFOC® lens or other micro lens arrangement with a predetermined acceptance angle $\alpha$. A SELFOC® lens is a gradient index lens which consists of fiber rods with parabolic index profile. In one embodiment, the SELFOC® lens has an acceptance angle $\alpha$ of about +/−9 degrees.

In one embodiment, the linear variable filter 306 is an optical narrow bandpass coated glass filter. In one embodiment, the center wavelength of the bandpass varies linearly from one end of the linear variable filter to the other. In another embodiment, the center wavelength of the bandpass varies in a logarithmic fashion along the length of the linear variable filter. In one embodiment, the linear variable filter comprises three different layers, a bandpass coating, a substrate and a blocker coating, through which the light reflecting off the substrate surface is configured to pass therethrough. In one embodiment, the linear variable filter achieves its spectral performance with a film (e.g., a bandpass coating) that varies in thickness across its face.

Figure 2:
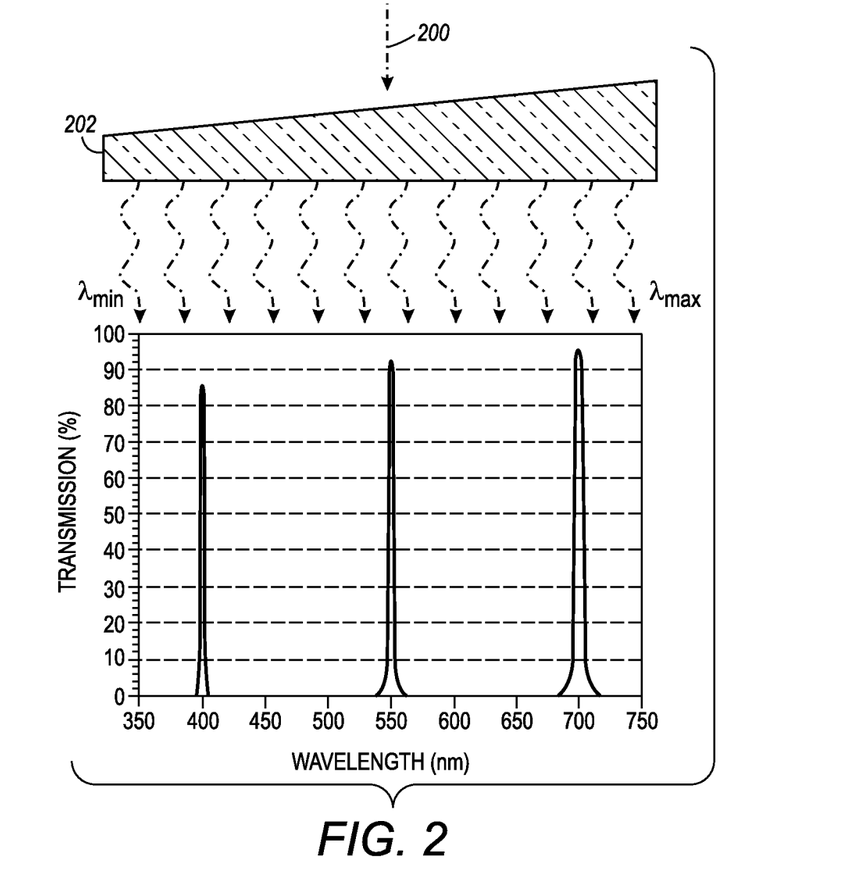
FIG. 2 shows a linear variable filter and a graph showing the spectra measured using the linear variable filter.

A linear variable filter that is used in the present disclosure is shown in FIG. 2. As shown in FIG. 2, a radiation 200 from a source (e.g., an illuminator) that produces a broad, continuous spectrum of frequencies is incident on a linear variable filter 202. In one embodiment, the radiation 200 is referred to as a broadband radiation. The graph in FIG. 2 shows the spectra measured using the linear variable filter 202. The graph in FIG. 2 illustrates the transmission in percentage along a vertical Y-axis. On a horizontal X-axis, the graphs illustrate wavelength, which is represented in nanometers.

Suitable linear variable filter of this type which are used in the present disclosure are available from the JDS Uniphase Corporation (JDSU) of Milpitas, Calif. The properties or specifications of a non-limiting example of such a linear variable filter are disclosed as follows: The spectral range of the linear variable filter is 400 to 700 nanometers. The half-power bandwidth of the linear variable filter is less than or equal to 1.5% of the center wavelength. The linear filter dispersion of the linear variable filter is 39.5 nanometer/millimeter, where the linear filter dispersion is within +/−0.8 nanometer/millimeter. The peak transmission of the linear variable filter is greater than or equal to 40% of bandpasses between 400 nanometers and 700 nanometers. The out-of-band blocking, T of the linear variable filter is less than or equal to 0.1% average and less than or equal to 0.5% absolute, for bandpasses 400 nanometers to 700 nanometers. The overall filter length of the linear variable filter is 8.87 millimeter, where the overall filter length is within +/−0.05 millimeter. The length of active area of the linear variable filter is 7.6 millimeter (approximately 180 pixels) nominal, approximately centered on the part. The overall filter width of the linear variable filter is 1.00 millimeter, where the overall filter width is within +/−0.05 millimeter. The filter thickness of the linear variable filter is 1.1 millimeter, where the filter thickness is within +/−0.1 millimeter.

Referring back to FIGS. 3A and 3B, in one embodiment, the linear sensor 308 is, for example, a full width array (FWA) image sensor. A full width array sensor is defined as a sensor that extends substantially an entire width (perpendicular to a direction of motion) of the moving substrate surface. The full width array sensor is configured to detect any desired part of the deposited film, while depositing films over a web. The full width array sensor may include a plurality of sensors equally spaced at intervals (e.g., every 1/600th inch (600 spots per inch)) in the cross-process (or fast scan) direction. See for example, U.S. Pat. No. 6,975,949, incorporated herein by reference. It is understood that other linear array sensors may also be used, such as contact image sensors, CMOS array sensors or CCD array sensors.

It is contemplated that the present disclosure may use an image sensor chip, which is significantly smaller than the width of the image bearing surface. The sensor chip is configured to detect only a portion of the printed image, and not the entire width of the printed image. In one embodiment, the sensing system 300 of the present disclosure may be a spot or patch spectrophotometer for performing spot measurements. FIG. 3A shows a spot sensor architecture in which the linear sensor is a single chip sensor. In the spot sensor architecture, the chip sensor includes a single row, where the row includes M number of pixels. In the spot sensor architecture, the orientation of a wedge of the linear variable filter is along the length of the linear sensor or the chip sensor, where each pixel of the chip sensor corresponds to a different color of the colored patch. It is contemplated that the present disclosure may also be used for a page width spatially resolved spectral imaging. In such an embodiment, the full-width array sensor includes N number of rows, where each row of the full-width array sensor corresponds to each color of the colored patch. Each of the rows includes M number of pixels. In the full-width array sensor architecture, the orientation of the wedge of the linear variable filter is perpendicular to the orientation of the wedge of the linear variable filter in the spot sensor architecture. In other words, the orientation of the wedge of the linear variable filter is along the N number of rows of the full-width array sensor.

In one embodiment, when used with illumination from the illuminator, the output of the linear sensor will indicate the reflectivity across the spectrum. In one embodiment, a processor may be provided to both calibrate the linear sensor and to process the reflectance data detected by the linear sensor. It could be dedicated hardware like ASICs or FPGAs, software, or a combination of dedicated hardware and software.

The net result of the system is that the nominal bandpass characteristics of the linear variable filter 306 are effectively broadened due to the gap between the linear variable filter 306 and the linear sensor 308. However, as noted above, the present disclosure proposes that if the gap G between the linear variable filter 308 to the linear sensor 308 is small enough, and the angular spread of light imaged by the gradient index lens 304 is small enough, then these effects are acceptable.

In one embodiment, as shown in FIGS. 3A-3C, the linear variable filter 306 and the linear sensor 308 are spaced apart by the gap G. In one embodiment, the gap G is maintained small, for example, 1 millimeter as described in detail in an example below. In another embodiment, the gap G may be more than or less than 1 millimeter. In one embodiment, the allowable gap between the linear variable filter 306 and the linear sensor 308 depends upon a desired resolution in a spectral measurement by an end user, while still keeping the effect of effectively broadening the nominal bandpass characteristics of the linear variable filter acceptable. For example, if a first end user only needs half as much spectral resolution as a second end user, then, to zeroeth order, the first end user can have twice as much gap G between the linear variable filter 306 and the linear sensor 308 as the second end user. In one embodiment, the gap is reduced to such a point that the residual error induced by that gap is acceptable to the image quality of the system. In other words, for a reasonable gap the redemption of image quality is negligible. In one embodiment, the gap G between the linear variable filter 306 and the linear sensor 308 is maintained in the order of about 1 millimeter so that the end user may position a cover glass or the like in between the linear variable filter and the linear sensor.

Referring to FIGS. 3A and 3B, in one embodiment, as noted above, the object being imaged is deposited film 302A which may be any deposited film, including films that form a portion of a belt photoreceptor, or may even be a toner image, such as a uniformly colored patch. In one embodiment, different portions of the film 302A are imaged to different pixels of the linear sensor 308. In one embodiment, located above each pixel of the linear sensor 308 is a particular portion of the linear variable filter 306 and its spectral bandpass characteristics. Thus, each pixel of the linear sensor 308 responds to light that only falls within the bandpass of the neighboring the linear variable filter section. The collection of pixel outputs, thus, represent the spectral content of the film 302A, including the contribution from the illumination. In one embodiment, calibration techniques may be used later to separate out the illumination contribution, thus, leaving just the spectral reflectance information of the film 302A.

The light beams reflecting off the film 302A are imaged by the gradient index lens 304 onto the linear sensor 308. If the linear variable filter is placed in close proximity to the linear sensor, the pixel outputs from the linear sensor will correspond to light beams that has been wavelength-filtered by the linear variable filter. For example, assuming the spectral range of the linear variable filter is 400 nanometers to 700 nanometers, the output of pixel #1 of the linear sensor corresponds to the amount of light at 400 nanometers, and the output of pixel #n of the linear sensor corresponds to the amount of light at 700 nanometers, etc.

When the linear variable filter is preferably not located at the image plane, or the linear variable filter is preferably not located at the focal point of the lens, then this may result in a mixing problem. There are two situations of interest, described below in greater detail, that relate to mixing of information between the spatial extent of the patch of interest and the linear variable filter, when the linear variable filter is preferably not in perfect imaging condition.

In the first situation, the light beams reflecting off a point in the object plane (e.g., plane in which the film 302A is placed) that are contained within the acceptance angle α of the self-focusing gradient index lens 304 are imaged onto the linear sensor 308. Preferably, if the linear variable filter 306 is not placed on the linear sensor 308, various parts of the cone of light pass through slightly different portions of the linear variable filter 306, hence the linear sensor pixel at the image of that particular point collects light beams that represent a weighted average of light with slightly different bandpass characteristics.

In the second situation, there are light beams from a different object (e.g., film 302A) point that passes through the nominal bandpass location of the pixel of interest on the linear sensor. Thus, a neighboring pixel on the linear sensor responds to the light beams, the spectral content of which was intended for a different pixel on the linear sensor 308. The second situation may not be important in the case where the light beams reflecting off the uniformly colored patch are imaged by the self-focusing gradient index lens (e.g., SELFOC® lens) onto the linear sensor.

In one embodiment, a reasonable gap may be maintained between the linear variable filter and the linear sensor to maintain the above discussed mixing conditions small enough to get an acceptable image quality performance of the system.

Discussed below is an example that shows that a small gap G, for example, in the order of about 1 millimeter, between the linear variable filter and the linear sensor keeps the effect of effectively broadening the nominal bandpass characteristics of the linear variable filter acceptable.

A typical self-focusing gradient index lens (e.g., SELFOC® lens) used for imaging constrains all imaged light to a cone of +/−9 degrees. In other words, the self-focusing gradient index lens (e.g., SELFOC® lens) has an acceptance angle .alpha. of about +/−9 degrees. In one embodiment, the imaging condition is not necessarily needed for a spot sensor, however, spatially resolved page sensors will require imaging.

If the nominal distance or the gap G between the linear variable filter and the linear sensor is 1 mm, then the "circle of confusion" on the linear variable filter (or, equivalently, at the linear sensor) is +/−0.16 mm. In one embodiment, the "circle of confusion" is obtained by calculating the tangent of the acceptance angle of the self-focusing gradient index lens. For example, the tangent of the acceptance angle .alpha. of the self-focusing gradient index lens (e.g., about +/−9 degrees) is +/−0.16 mm As disclosed above, the half-power bandwidth (HPBW) of the linear variable filter is less than or equal to 1.5% of the center wavelength (CWL) of bandpass of the linear variable filter. As shown in FIG. 2, the center wavelength of bandpass of the linear variable filter is 550 nm. For the center wavelength of bandpass of the linear variable filter is equal to 550 nm, the half-power bandwidth of the linear variable filter is less than or equal to 8.3 nm. Also, as disclosed above, linear filter dispersion of the linear variable filter is 39.5 nanometer/millimeter, where the linear filter dispersion is within +/−0.8 nanometer/millimeter. So, the circle of confusion will create a weighted additional wavelength spread of +/−6 nm. This is obtained by calculating the product of the linear filter dispersion (e.g., 39.5 nanometer/millimeter) of the linear variable filter and the circle of confusion on the linear variable filter.

Thus, the effective bandpass of the linear variable filter will be broadened slightly by the convolution of the linear variable filter inherent half-power bandwidth and the angularly weighted circle of confusion, but not unacceptably. Even if the half-power bandwidth of the linear variable filter doubles to 16 nanometers, that represents (700–400)/16=19 distinct wavelength samples, which is more than the number of samples of the other in-line spectrophotometers. In addition, because each "distinct" wavelength sample consists of multiple pixels at slightly different wavelength shifts, much more spectral information is available for analysis.

The present disclosure, thus, provides a sensing system that images a deposited film onto the linear variable filter and linear sensor assembly, where the pixel output of the sensing system will correspond to the relative spectral reflectivity of the colored patch, which can then be used to determine and influence color performance and/or deposition parameter (e.g., thickness of the deposited film) of an image printing system or film manufacturing system. As noted above, the concept discussed in the present disclosure may be used for both spot measurement as well as page width spatially resolved spectral imaging. The linear variable filter placed between a linear sensor and a gradient index lens creates a compact, low cost, spectrophotometer for in-line measurement of deposited films, such as layers of a photoreceptor or toner images, the measurements including thickness measurement or color output print measurement. One of the advantages of the present disclosure is to provide a spectrophotometer for in-line color output print measurement and/or thickness output measurement, the spectrophotometer having a much lower cost compared to other alternatives of inline spectrophotometers.

Figure 4:
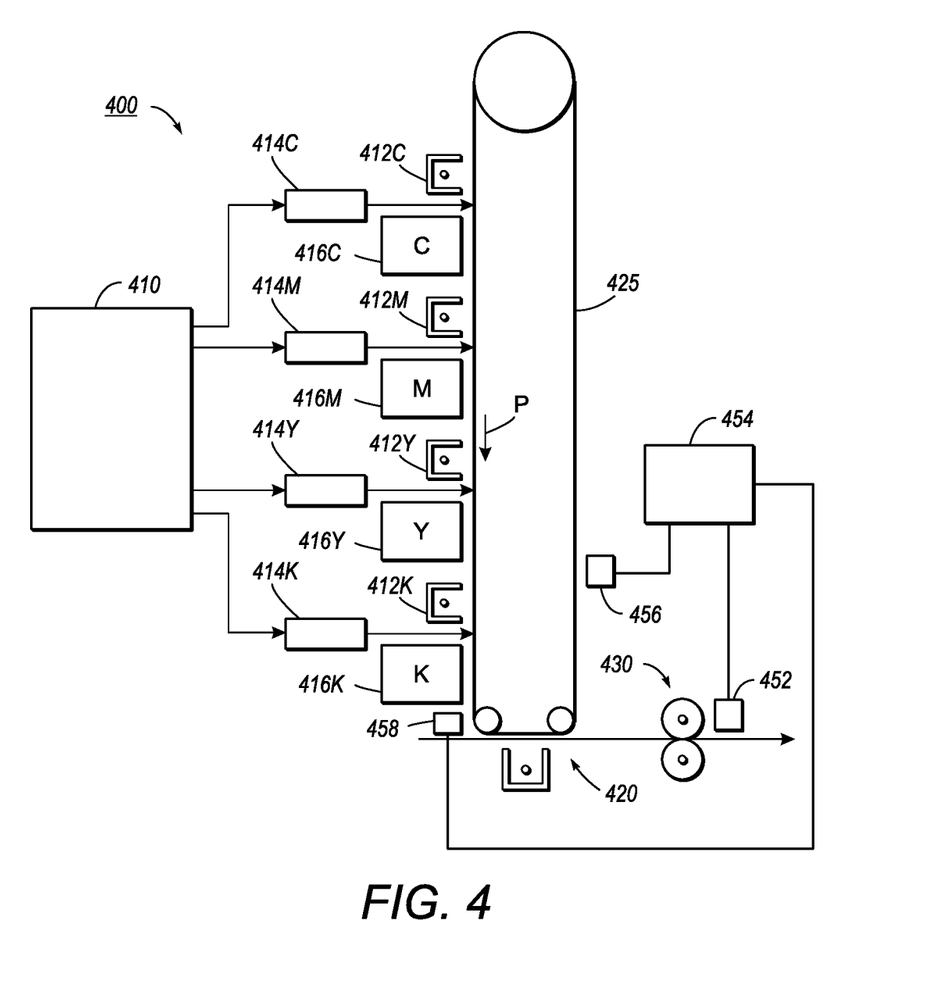
FIG. 4 is a simplified elevational view of basic elements of a xerographic color printer, showing a context of the various embodiments. It should be noted that some details of the figure have been simplified and are drawn to facilitate understanding of the embodiments rather than to maintain strict structural accuracy, detail, and scale.

FIG. 4 is a simplified elevational view of basic elements of an image printing system, showing a context of the present disclosure. Specifically, there is shown an "image-on-image" xerographic color printer, in which successive primary-color images are accumulated on an image bearing surface (e.g., photoreceptor belt), and the accumulated superimposed images are in one step directly transferred to an output sheet as a full-color image. In one implementation, the Xerox® iGen3® digital printing press may be utilized. However, it is appreciated that any image printing system, such as monochrome machines using any technology, machines which print on photosensitive substrates, xerographic machines with multiple photoreceptors, or ink-jet-based machines, can beneficially utilize the present disclosure as well.

Specifically, the FIG. 4 embodiment includes an image bearing surface 425 (e.g., belt photoreceptor), along which are disposed a series of stations, as is generally familiar in the art of xerography, one set for each primary color to be printed. For instance, to place a cyan color separation image on the image bearing surface 425, there is used a charge corotron 412C, an imaging laser 414C, and a development unit 416C. For successive color separations, there is provided equivalent elements 412M, 414M, 416M (for magenta), 412Y, 414Y, 416Y (for yellow), and 412K, 414K, 416K (for black). The successive color separations are built up in a superimposed manner on the surface of the image bearing surface 425, and then the combined full-color image is transferred at transfer station 420 to an output sheet. The output sheet is then run through a fuser 430, as is familiar in xerography. Printing process may be controlled, for example, by a print controller 410.

As is familiar in the art of "laser printing," by coordinating the modulation of the various lasers with the motion of the image bearing surface 425 and other hardware (such as rotating mirrors, etc., not shown), the lasers discharge areas on the image bearing surface 425 to create the desired printing, particularly after these areas are developed by their respective development units 416C, 416M, 416Y, 416K.

In one embodiment, the sensing system 300 or sensing system 310 of the present disclosure (as shown in FIGS. 3A-3C) may be placed in the image printing system to directly monitor printed images as they exit the device, for example, at location 452. In another embodiment, the sensing system 300 or sensing system 310 of the present disclosure (as shown in FIGS. 3A-3C) can be placed just before or just after the transfer station 420 where the toner is transferred to the sheet or media, for example, at locations 456, 458 for monitoring images directly on the image bearing surface or other intermediate transfer members. The sensing system 300 or sensing system 310 of the present disclosure (as shown in FIGS. 3A-3C) can make measurements of toner images created on the image bearing surface 425 (such as at locations 456 and 458) or to printed images which were transferred to an output sheet (such as at location 452). There may be provided any number of sensing device placed anywhere in the printer as needed, not only in the locations illustrated.

The sensing systems located at 452, 456 and 458 provide feedback to a control device 454 for taking action in response to critical measurements taken. The information gathered therefrom is used by control device 454 and/or the print controller 410 in various ways to aid in the operation of the printer, whether in a real-time feedback loop, an offline calibration process, a registration system, etc. While the control device 454 are shown in the figure as being separate elements, it will be appreciated that in some implementations, the control device 454 may be a part of the print controller 410.

Figure 5:
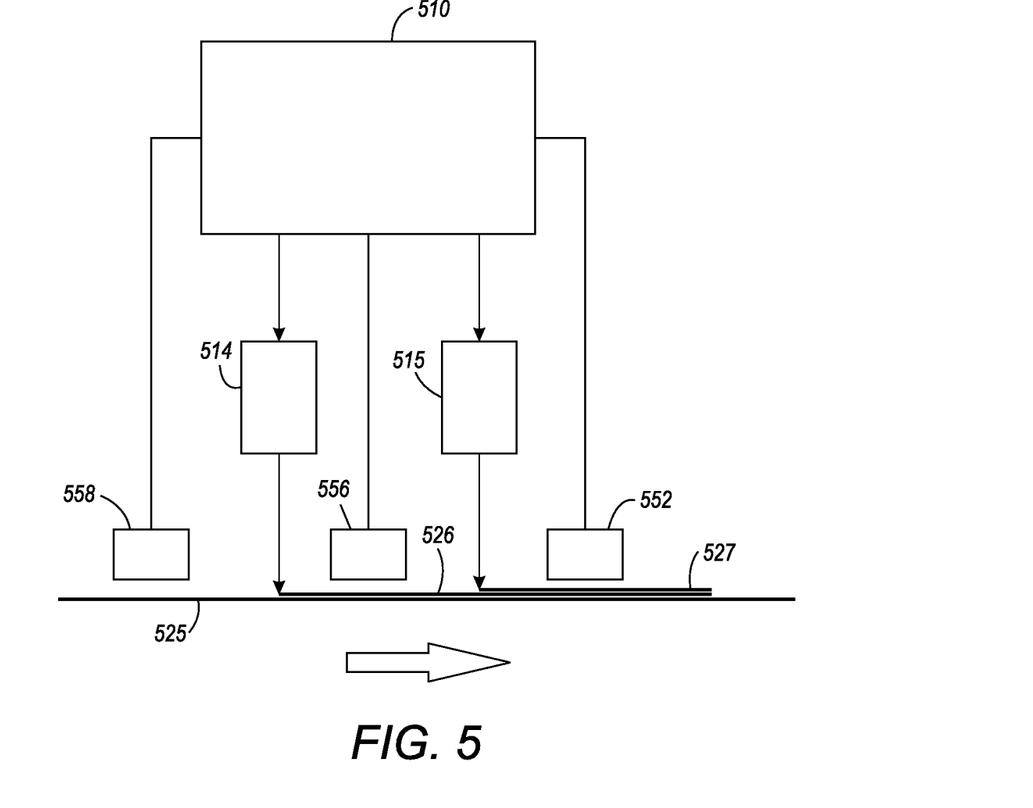
FIG. 5 is a simplified elevational view of basic elements of a system for manufacturing belt photoreceptors, showing a context of the various embodiments.

FIG. 5 is a simplified elevational view of basic elements of a film deposition system, showing a context of the present disclosure. Specifically, there is shown a continuous feed arrangement, in which successive films are accumulated on a substrate surface (e.g., web while the substrate is in motion, and the accumulated films form at least a portion of a belt photoreceptor). In one embodiment, the film deposition system may be utilized for manufacturing a photoreceptor. A photoreceptor may be manufactured in a roll to roll process. A plurality of successive layers are deposited over a substrate in liquid form and allowed to cure. Thickness of some or all of the plurality of layers require careful monitoring to ensure a properly functioning photoreceptor. Accordingly, in such an embodiment, layer thickness measurements may be taken in-situ using sensors, such as those described in sensing system 300 or sensing system 310 of the present disclosure, which may be utilized as point sensors. For example, a full width array imaging sensor modified with a linear variable filter enables the capturing of spectral data reflected from or transmitted through the various layer (i.e., films) and allows spectral captures of individual sites along the various layers and/or substrate. The sensor may be placed in proximity of each layer as it is manufactured in a continuous feed, or roll-to-roll arrangement. Each spectral capture site can monitor the film thickness by analyzing the spectrum detected by the sensor. The sensor may include multiple capture sites, including up to 1 site per inch. Thus, the sensor systems of the present disclosure can be useful for maintaining quality control of the production of photoreceptors or fuser roll devices or any article manufactured by a layer deposition process.

Accordingly, in one implementation for using the sensing system 300 or sensing system 310 of the present disclosure for photoreceptor manufacturing, the FIG. 5 embodiment includes a continuous substrate 525 (e.g., a web), the surface of which is fed past a series of stations 514, 515, as is generally familiar in the art of film deposition, one station for each film to be deposited. For instance, a film deposition station 514 is used to place/deposit a first film 526 on the substrate's surface. For successive films, there is provided an equivalent station, such as 515, for a placing/depositing a second film 527. The successive films are built up in a superimposed manner on the surface of the substrate 525 to form a portion of a final device (not shown). The film deposition process may be controlled, for example, by a deposition control device 510.

As is familiar in the art of continuous feed film deposition or roll-to-roll film deposition, by coordinating the activity of the deposition stations 514, 515 with the motion of the substrate 525 and other hardware (such as pulleys, feedstock rollers, etc., not shown), the film deposition stations eject film material on the substrate's surface to create the desired film(s). The right-pointing arrow indicates substrate motion.

The sensing system 300 or sensing system 310 of the present disclosure (as shown in FIGS. 3A-3C) can make measurements of films deposited on the substrate surface 425. In one embodiment, the sensing system 300 or sensing system 310 of the present disclosure (as shown in FIGS. 3A-3C) may be placed in the film deposition system to directly monitor an incoming surface of a substrate, such as a web substrate, for example, at locations 558. The sensing system 300 or sensing system 310 of the present disclosure (as shown in FIGS. 3A-3C) can be placed just after the deposition system stations 514 where a parameter, such as a color and/or thickness the first film 526 may be analyzed, for example, at locations 556. The sensing system 300 or sensing system 310 of the present disclosure (as shown in FIGS. 3A-3C) can be placed just after the deposition system stations 515 where a parameter, such as a color and/or thickness of the second film 527 may be analyzed, for example, at locations 552. There may be provided any number of sensing systems such as sensing systems 300 and/or 310 placed anywhere in the deposition system as needed, not only in the locations illustrated.

The sensing systems 300 or 310 at locations 552, 556 and 558, respectively, provide feedback to a control device 510 for taking action in response to the measurements, such as spectral measurements of light reflected from or transmitted through at least one of the substrate and/or layer deposited on the substrate as measured by the sensing devices of the sensing systems 300 or 310. The information gathered therefrom is used by control device 510, which may control deposition stations 514 and 515 in various ways to aid in the operation of the deposition system, whether in a real-time feedback loop, an offline calibration process, a registration system, etc. While the control device 510 may include an on-board controller (not shown), or control device 510 and a corresponding controller (not shown) may be separate elements. Accordingly, one embodiment of the present disclosure is a method of operating the implementation of FIG. 5. The method may provide for scanning the layers deposited on the substrate using the sensing system 300 disclosed above. The rate of scanning may be defined by a scan time, wherein a time between emitting the light beam and determining a thickness of the film based on spectral reflectivity of the film received from the linear sensor defines a scan time. In an example, scan times may be a rate of less than or equal to about 90 μs per scan. Therefore, the substrate motion (indicated by the arrow) may be at a fast speed because measurements are performed in-line as the layers are deposited on the substrate and because of the fast scan times. The determined/measured thickness based on the spectral reflectivity collected by sensor systems 300 or 310 may be compared, such as by a processor executing software instructions, to a predetermined thickness value stored in a memory in communication with the processor. If a difference between the determined/measured thickness and the predetermined thickness value is greater than a predetermined tolerance, the control device may adjust one or more of the various deposition parameters such as substrate feed speed, deposition time, deposition volume (i.e., the amount of material deposited on the substrate), etc.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function.

Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method for providing film-thickness analysis with a spectrophotometer, the method comprising:
   configuring an illuminator to emit a light beam at a first film deposited on a substrate surface, the illuminator being positioned adjacent to the substrate surface;
   configuring a first linear sensor to receive light reflecting off the deposited first film on the substrate surface via a gradient index lens and a first linear variable filter, the first linear sensor being positioned adjacent to substrate, the gradient index lens being placed in an optical path of the light beams reflecting off the substrate surface, and being positioned in between the substrate surface and the first linear variable filter, and the first linear variable filter being placed in the optical path of the light reflecting off the substrate surface, and being positioned between the first linear sensor and the gradient index lens;
   configuring a processor to determine thickness of the film based on spectral reflectivity of the film received from the linear sensor, configuring a second illuminator to emit a light beam at a second film disposed on the first film;

configuring a second linear sensor at a different location than the first linear sensor to receive light reflecting off the second film disposed on the on the first film via a second gradient index lens and a second linear variable filter, the second linear sensor being positioned adjacent to the substrate, the second gradient index lens being placed in an optical path of the light reflecting off the a surface of the first film, and being positioned in between the first film's surface and a second linear variable filter, and the second linear variable filter being placed in the optical path of the light beams reflecting off the first film's surface, and being positioned between the second linear sensor and the second gradient index lens; and configuring the processor to determine a thickness of the second film, based on a spectral reflectivity of the second film received from the second linear sensor, wherein the first linear variable filter is an optical filter having a bandpass coating and a property of the bandpass coating being varied across the length of the first linear variable filter so as to shift a center wavelength of the first linear variable filter linearly across the length of the first linear variable filter, and wherein the second linear variable filter is an optical filter having a bandpass coating and a property of the bandpass coating being varied across a length of the second linear variable filter so as to shift a center wavelength of the second linear variable filter linearly across the length of the second linear variable filter.

2. The method of claim 1, further comprising providing a gap between the first linear variable filter and the first linear sensor.

3. The method of claim 1, wherein the first linear sensor is a full width array image sensor.

4. The method of claim 1, wherein the first linear sensor is an image sensor chip.

5. The method of claim 1, wherein the substrate is at least one of a photoreceptor drum, a photoreceptor belt, an intermediate transfer belt, an intermediate transfer drum, an imaging drum, or a document.

6. The method of claim 1, wherein the property of the bandpass coating is a thickness of the coating.

7. The method of claim 1, wherein the first film comprises a layer of a belt photoreceptor.

8. The method of claim 1, wherein the substrate comprises a web.

9. The method of claim 1, wherein a time between emitting the light beam and determining a thickness of the first film based on spectral reflectivity of the first film received from the linear sensor defines a scan time.

10. The method of claim 9, wherein the scan time is less than or equal to about 90 µs.

11. The method of claim 1, further comprising:
configuring the processor to execute instructions, the instructions comprising:
comparing the thickness of the first film based on the spectral reflectivity to a predetermined thickness value; and
adjusting at least one deposition parameter to define an adjusted deposition parameter if a difference between the thickness of the first film and the predetermined thickness is greater than a predetermined tolerance.

12. The method of claim 11, wherein the at least one deposition parameter comprises at least one of a substrate feed speed, an amount of film material deposited on the substrate, or a deposition time.

13. The method of claim 11, wherein the instructions further comprise:
determining thickness of a second portion of the first film based on spectral reflectivity of the first film received from the first linear sensor, wherein the second portion of the first film is deposited based on the adjusted deposition parameters.

14. The method of claim 1, further comprising:
configuring the processor to execute instructions, the instructions comprising:
comparing the thickness of the second film based on the spectral reflectivity to a predetermined thickness value; and
adjusting at least one deposition parameter if a difference between the thickness of the second film and the predetermined thickness value is greater than a predetermined tolerance.

15. The method of claim 14, wherein the deposition parameter comprises at least one of a substrate feed speed, an amount of material deposited on the substrate as the second film, or a deposition time for depositing the second film.

16. The method of claim 1, further comprising depositing a liquid on the substrate and drying the liquid to form the film.

* * * * *